United States Patent
Wierer, Jr. et al.

(10) Patent No.: US 9,368,677 B2
(45) Date of Patent: Jun. 14, 2016

(54) SELECTIVE LAYER DISORDERING IN III-NITRIDES WITH A CAPPING LAYER

(71) Applicant: Sandia Corporation, Albuquerque, NM (US)

(72) Inventors: Jonathan J. Wierer, Jr., Albuquerque, NM (US); Andrew A. Allerman, Tijeras, NM (US)

(73) Assignee: Sandia Corporation, Albuquerque, NM (US)

( * ) Notice: Subject to any disclaimer, the term of this patent is extended or adjusted under 35 U.S.C. 154(b) by 38 days.

(21) Appl. No.: 14/540,686

(22) Filed: Nov. 13, 2014

(65) Prior Publication Data

US 2015/0079770 A1 Mar. 19, 2015

Related U.S. Application Data

(63) Continuation-in-part of application No. 13/558,516, filed on Jul. 26, 2012, now Pat. No. 8,895,335.

(60) Provisional application No. 61/513,924, filed on Aug. 1, 2011.

(51) Int. Cl.
*H01L 21/00* (2006.01)
*H01L 21/04* (2006.01)
*H01L 33/06* (2010.01)
(Continued)

(52) U.S. Cl.
CPC .......... *H01L 33/06* (2013.01); *H01L 21/0242* (2013.01); *H01L 21/0254* (2013.01); *H01L 21/0262* (2013.01); *H01L 21/02433* (2013.01); *H01L 21/02458* (2013.01); *H01L 21/02507* (2013.01); *H01L 21/02576* (2013.01); *H01L 21/02579* (2013.01); *H01L 21/02664* (2013.01); *H01L 21/324* (2013.01); *H01L 21/44* (2013.01); *H01L 31/035236* (2013.01); *H01L 31/1856* (2013.01); *H01L 33/0066* (2013.01); *H01L 33/0075* (2013.01); *H01S 5/34333* (2013.01); *B82Y 40/00* (2013.01); *Y10S 977/89* (2013.01)

(58) Field of Classification Search
CPC ..... H01L 21/182; H01L 21/44; H01L 29/154; H01S 5/3206; H01S 5/3209
USPC .............. 438/36, 511; 257/E21.086, E29.077
See application file for complete search history.

(56) References Cited

U.S. PATENT DOCUMENTS

| 5,047,366 A | * | 9/1991 | Murakami | ............ H01L 21/033 148/DIG. 34 |
| 5,843,802 A | * | 12/1998 | Beernink | ............... B82Y 20/00 257/E21.086 |

(Continued)

OTHER PUBLICATIONS

W.D. Laidig, et al., Disorder of an AlAs-GaAs Superlattice by Impurity Diffusion, Appl. Phys. Lett. 38 (10), May 15, 1981, pp. 776-778.

(Continued)

*Primary Examiner* — Moazzam Hossain
(74) *Attorney, Agent, or Firm* — Kevin W. Bieg

(57) ABSTRACT

Selective layer disordering in a doped III-nitride superlattice can be achieved by depositing a dielectric capping layer on a portion of the surface of the superlattice and annealing the superlattice to induce disorder of the layer interfaces under the uncapped portion and suppress disorder of the interfaces under the capped portion. The method can be used to create devices, such as optical waveguides, light-emitting diodes, photodetectors, solar cells, modulators, laser, and amplifiers.

18 Claims, 5 Drawing Sheets

(51) Int. Cl.
*H01L 31/18* (2006.01)
*H01S 5/343* (2006.01)
*H01L 33/00* (2010.01)
*H01L 31/0352* (2006.01)
*H01L 21/02* (2006.01)
*H01L 21/44* (2006.01)
*H01L 21/324* (2006.01)
*B82Y 40/00* (2011.01)

(56) References Cited

U.S. PATENT DOCUMENTS

| | | | | |
|---|---|---|---|---|
| 6,002,142 | A | * 12/1999 | Paoli | H01L 27/1443 257/184 |
| 7,160,748 | B2 | 1/2007 | Ishibashi et al. | |
| 8,486,814 | B2 | 7/2013 | Clarke et al. | |
| 2004/0175852 | A1* | 9/2004 | Ooi | B82Y 20/00 438/22 |
| 2005/0142682 | A1* | 6/2005 | Ishibashi | B82Y 20/00 438/45 |
| 2005/0153473 | A1* | 7/2005 | Teng | B82Y 10/00 438/47 |
| 2006/0165143 | A1* | 7/2006 | Ohno | B82Y 20/00 372/46.015 |
| 2007/0298531 | A1* | 12/2007 | Najda | H01S 5/34 438/47 |
| 2008/0203382 | A1* | 8/2008 | Yanagihara | H01L 21/02381 257/18 |
| 2008/0233668 | A1* | 9/2008 | Abe | B82Y 20/00 438/31 |
| 2009/0086784 | A1* | 4/2009 | Li | B82Y 20/00 372/50.11 |
| 2009/0245316 | A1* | 10/2009 | Sysak | B82Y 20/00 372/50.121 |
| 2011/0134954 | A1* | 6/2011 | Letertre | H01S 5/183 372/50.11 |
| 2012/0286241 | A1* | 11/2012 | Hardy | H01L 21/02389 257/14 |
| 2013/0099203 | A1* | 4/2013 | Akita | B82Y 20/00 257/21 |

OTHER PUBLICATIONS

D.G. Deppe, et al., Impurity Diffusion and Layer Interdiffusion in AlxGa1-xAs-GaAs Heterostructures, J. Appl. Phys. 64(4), Aug. 15, 1988, pp. 1838-1844.

D.G. Deppe et al., Impurity-Induced Layer Disordering of High Gap Iny(AlxGa1-x)1-yP Heterostructures, Appl. Phys. Lett. 52(17),Apr. 25, 1988, pp. 1413-1415.

L.L. Chang and A. Koma, Interdiffusion between GaAs and AlAs, Applied Physics Letters, vol. 29, No. 3, Aug. 1, 1976, pp. 138-141.

K. Meehan, et al., Impurity-Induced Disordering of Single Well AlxGa1-xAs-GaAs Quantum Well Heterostructures, Appl. Phys. Lett. 44(4), Feb. 15, 1984, pp. 428-430.

S. Porowski et al., Annealing of GaN under High Pressure of Nitrogen, J. Phys.: Condens. Matter 14 (2002), pp. 11097-11110.

A.Y. Polyakov, et al., Optical Properties of Undoped n-AlGaN/GaN Superlattices as Affected by Built-In and External-Electric Field and by Ar-Implantation-Induced Partial Disordering, Journal of Electronic Materials, vol. 31, No. 5, 2002, pp. 384-390.

M.D. McCluskey, et al., Disordering of InGaN/GaN Superlattices after High-Pressure Annealing, MRS Internet J. Nitride Semicond. Res. 4S1, G3.42 (1999), 6 pages.

Michael C.Y. Chan, et al., Thermal Annealing of InGaN/GaN Strained-Layer Quantum Well, MRS Internet J. Nitride Semicond. Res. 4S1, G6.25 (1999), 6 pages.

N. Iizuka, et al., Sub-Picosecond All-Optical Gate Utilizing aN Intersubband Transition, Optics Express, vol. 13, No. 10, May 16, 2005, pp. 3835-3840.

Daniel Hofstetter, et al., GaN/AlN-Based Quantum-Well Infrared Photodetector for 1.55 μm, Applied Physics Letters, vol. 83, No. 3, Jul. 21, 2003, pp. 572-574.

Claire Gmachl, et al., Intersubband Absorption in GaN/AlGaN Multiple Quantum Wells in the Wavelength Range of λ ~ 1.75-4.2 μm, Applied Physics Letters, vol. 77, No. 3, Jul. 17, 2000, pp. 334-336.

S. Nicolay, et al., Indium Surfactant Effect on Aln/GaN Heterostructures Grown by Metal-Organic Vapor-Phase Epitaxy: Applications to Intersubband Transitions, Applied Physics Letters 88, 151902 (2006), pp. 151902-1-151902-3.

Jung-Seung Yang, et al., Blueshift of Intersubband Transition Wavelength in AlN/GaN Multiple Quantum Wells by Low Temperature Metal Organic Vapor Phase Epitaxy using Pulse Injection Method, Applied Physics Letters 95, 162111 (2009), pp. 1622111-1-162111-3.

J.J. Wierer Jr., et al., Silicon Impurity-Induced Layer Disordering of AlGaN/AlN Superlattices, Applied Physics Letters 97 (2010), pp. 051907-1-051907-3.

* cited by examiner

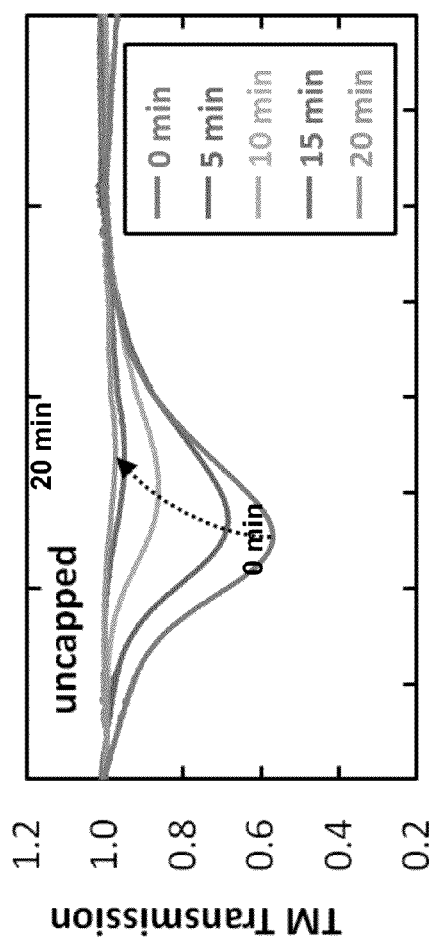
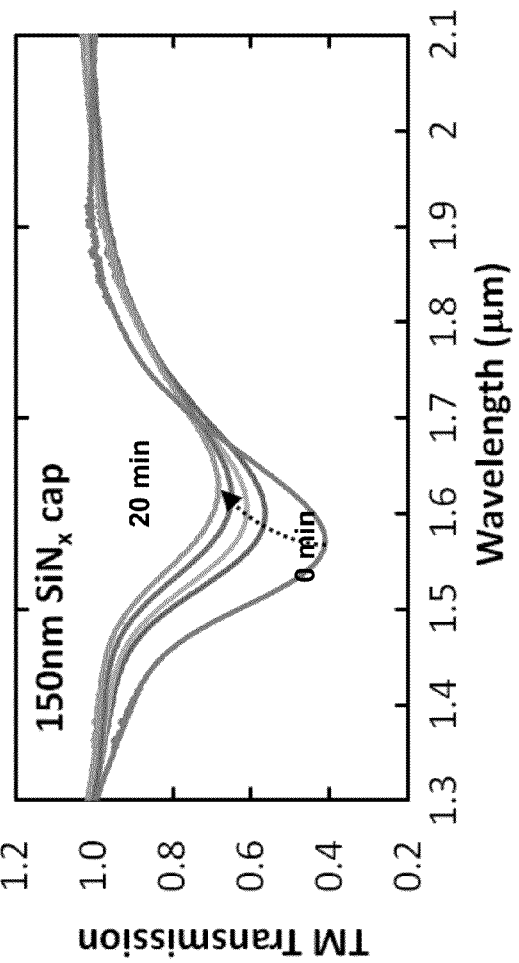
FIG. 2(a)
FIG. 2(b)

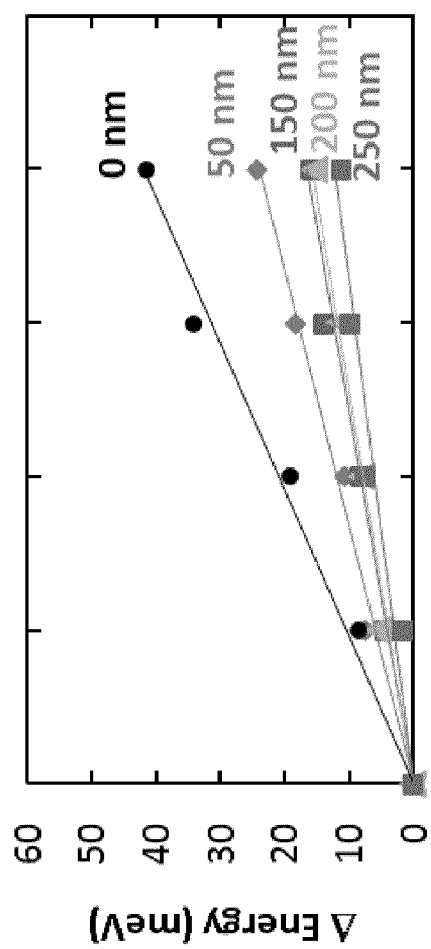
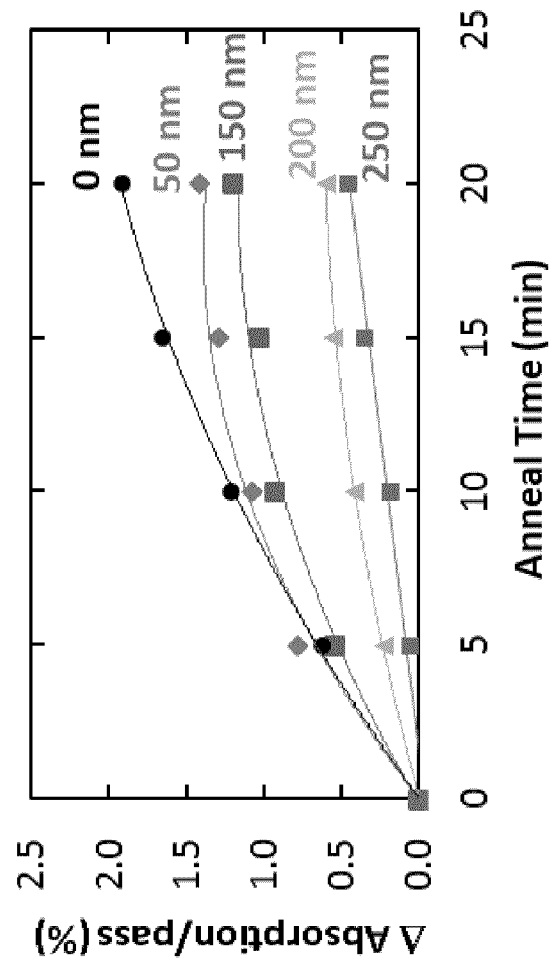

US 9,368,677 B2

SELECTIVE LAYER DISORDERING IN III-NITRIDES WITH A CAPPING LAYER

CROSS-REFERENCE TO RELATED APPLICATIONS

This application is a continuation-in-part of U.S. application Ser. No. 13/558,516, filed Jul. 26, 2012, which claimed the benefit of U.S. Provisional Application No. 61/513,924, filed Aug. 1, 2011, both of which are incorporated herein by reference.

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention relates to compound semiconductors and, in particular, to a method for selective layer disordering in III-nitrides using a capping layer.

BACKGROUND OF THE INVENTION

AlGaN-based heterostructures have large conduction band offsets to support intersubband transitions at telecommunication wavelengths (1.3 µm and 1.55 µm). See C. Gmachl et al., *Appl. Phys. Lett.* 77, 3722 (2000); N. Suzuki and N. Iizuka, *Jpn. J. Appl. Phys.* 2 38, L363 (1999); D. Hofstetter et al., *Proc. IEEE* 98, 1234 (2010); and M. Beeler et al., *Semicond. Sci. Tech.* 28, 074022 (2013). Various III-nitride intersubband structures have been demonstrated, such as optical modulators, quantum cascade lasers, and photodetectors. See N. Suzuki and N. Iizuka, *Jpn. J. Appl. Phys.* 2 36, L1006 (1997); N. Iizuka et al., *Electron. Lett.* 40, 962 (2004); G. Sun et al., *Superlattice Microst.* 37, 107 (2005); D. Hofstetter et al., *Appl. Phys. Lett.* 83, 572 (2003); and D. Hofstetter et al., *J. Phys.-Condens. Mat.* 21, 174208 (2009). These demonstrations are limited to discrete devices, indicating they are farther behind other III-V compound semiconductor devices that have processing methods to integrate multiple devices and create photonic integrated circuits. For III-nitride devices to compete with existing technologies, new integration techniques are required.

SUMMARY OF THE INVENTION

The present invention is directed to a method for selective layer disordering in III-nitrides, comprising growing a III-nitride heterostructure on a substrate at a growth temperature chosen to prevent layer disordering and doping one or more of the heterostructure layers with an impurity during growth, depositing a dielectric capping layer on a portion of the surface of the heterostructure to provide a capped portion and an uncapped portion, and annealing the heterostructure at an annealing temperature and time sufficient to induce disorder of the heterostructure layer interfaces under the uncapped portion and suppress disorder of the interfaces under the capped portion. For example, the heterostructure can be a superlattice comprising a periodic structure of AlGaN/AlN, GaN/AlN, GaN/AlGaN, InGaN/GaN, InGaN/AlN, InGaN/AlGaN, AlInN/GaN, AlInN/AlN, or AlInN/InGaN layers. For example, the impurity can comprise silicon, magnesium, selenium, or tellurium, preferably with a dopant concentration of greater than $5 \times 10^{18}$ cm$^{-3}$. The superlattice can be grown by metal-organic vapor phase epitaxy, molecular beam epitaxy, and vapor phase epitaxy, preferably at a growth temperature of less than 885° C. The annealing temperature is preferably greater than 700° C. and, more preferably, greater than 1000° C. For example, the substrate can comprise sapphire or SiC, preferably with an intervening low dislocation density template layer. Alternatively, the substrate can comprise a material having an inherently low dislocation density, such as AlN, GaN, or alloys thereof. For example, the dielectric capping layer can comprise SiN, SiON, or SiO$_2$.

As an example of the invention, selective layer disordering in an intersubband $Al_{0.028}Ga_{0.972}N/AlN$ superlattice with a silicon nitride (SiN$_x$) capping layer was demonstrated. When the $Al_{0.028}Ga_{0.972}N/AlN$ superlattice is subject to a high temperature anneal the SiNx capped portions suppress layer disordering compared to the uncapped portions. Additionally, the rate of layer disordering is reduced as the thickness of the SiN$_x$ is increased. The SiN$_x$ layer inhibits vacancy formation at the epitaxial layer surface, slowing down Si diffusion from the doped quantum wells, and the movement of Al and Ga atoms within the lattice and across the heterointerfaces. Patterning of the SiN$_x$ layer results in selective layer disordering, an attractive process for integrating active III-nitride based intersubband devices with passive low-loss waveguides.

The method can be used to create devices, such as optical waveguides, light-emitting diodes, photodetectors, solar cells, modulators, laser, and amplifiers. For example, selective disordering can be useful in III-nitride photonic integrated circuits creating active and passive regions of the chip. With this method, passive waveguides can be integrated with an intersubband optical modulator using only one epitaxial material growth run. An absorbing modulator structure can be grown and selective layer disordering can be used to create passive, non-absorbing, portions that can behave as waveguides. Likewise, higher bandgap regions of a laser diode can also be created either near the output facets, to prevent optical damage, or outside the active stripe region to help confine the laser mode.

BRIEF DESCRIPTION OF THE DRAWINGS

The detailed description will refer to the following drawings, wherein like elements are referred to by like numbers.

FIGS. 2(a) and 2(b) are graphs of the transverse magnetic (TM) light transmission versus wavelength of Si-doped $Al_{0.028}Ga_{0.972}N/AlN$ superlattices grown at 800° C. and annealed at 1000° C. for 0-20 minutes. FIG. 2(a) shows the transmission under the uncapped portion. FIG. 2(b) shows the transmission of the portion capped with 150 nm SiN$_x$.

FIG. 3(a) is a graph of the change in energy of the absorption peak as a function of annealing time for samples capped with 0 to 250 nm of SiN$_x$. FIG. 3(b) is a graph of change in absorption of the peak as a function of annealing time for samples capped with 0 to 250 nm of SiN$_x$.

DETAILED DESCRIPTION OF THE INVENTION

A method used in conventional III-V compound semiconductors for device integration is layer disordering. Impurity-induced layer disordering (IILD) or layer intermixing is a well-studied phenomena in the III-arsenide and III-phosphide material systems. See W. D. Ladig et al., *Appl. Phys. Lett.* 38, 776 (1981); D. G. Deppe and N. Holoyak, Jr., *J. Appl. Phys.* 64, R93 (1988); and D. G. Deppe et al., *Appl. Phys. Lett.* 52, 1413 (1988). Normally an unintentionally doped (UID) heterointerface, such as an AlAs/GaAs, is stable (no Al—Ga interdiffusion) up to high temperatures (~900° C.). See L. L. Chang and A. Koma, *Appl. Phys. Lett.* 29, 138 (1976). The introduction of impurities by diffusion, implantation, or during growth lowers the temperature where layer disordering can occur. The impurity diffuses at these lower temperatures, and as it travels through the semiconductor layers the crystal atoms can reorganize, leading to intermixing of the heterointerfaces. In particular, movement of vacancies or impurities within the semiconductor lattice promotes congruent movement of the column III atoms within the semiconductor lattice. The rearrangement of the column III atoms causes the heterointerfaces to become less abrupt and shifts the electronic states within the quantum wells. For interband (bandgap) transitions this causes a blue-shift in the wavelength, and in intersubband transitions it causes a red-shift in wavelength. If this method is selective (site specific), one can produce portions of the superlattice that are not absorbing.

III-nitrides have been thought to be stable under standard growth and processing temperatures because of their high crystal bond strength and low diffusivity of impurities. However, layer disordering has recently been found to be also possible in III-nitride semiconductors. See J. J. Wierer et al., *Appl. Phys. Lett.* 97 (2010); and U.S. application Ser. No. 13/558,516. In particular, highly Si-doped quantum wells (QWs) used for intersubband absorption have been shown to layer disorder when subject to high growth temperatures or subject to post-growth high temperature annealing. At high temperatures, the Si diffuses out of the QWs of the superlattice, promoting layer disordering of the heterointerfaces, thereby decreasing and red-shifting the absorption. Layer disordering is prevented (mitigated) at growth temperatures lower than 885° C., and is a fundamental material phenomena regardless of the method used to grow the sample. Layer disordering with the as-grown doping is not selective, however, requiring an alternative process to make selective layer disordering possible.

Figure 1:
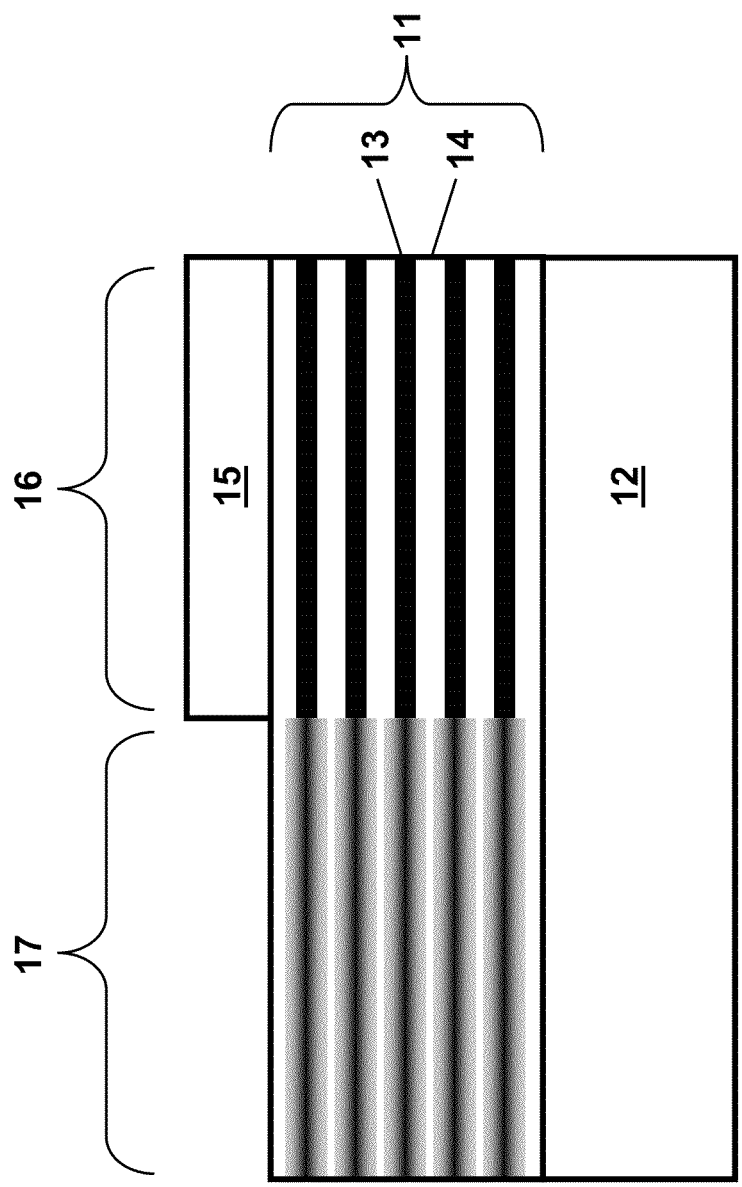
FIG. 1 is a schematic illustration of a superlattice comprising an uncapped portion and a portion capped with a dielectric layer.

The present invention is directed to a method of selective impurity-induced layer disordering in III-nitride materials and devices made therewith. As shown in FIG. 1, the method for selective impurity-induced layer disordering in III-nitride materials comprises growing an III-nitride heterostructure 11 on a substrate 12. The heterostructure 11 can be a superlattice comprising a periodic structure of (nano-)layers of two or more III-nitride semiconductor materials with different band gaps at least some of which are doped with an impurity during growth. For example, the superlattice 11 can comprise a plurality of alternating quantum well 13 and barrier 14 layers wherein the quantum well layers 13 are doped during growth. The superlattice is grown at a sufficiently low growth temperature to prevent layer disordering during growth. A dielectric capping layer 15 is deposited on a portion 16 of the surface of the superlattice 11 prior to the post-growth annealing. The superlattice 11 can then be selectively disordered when the post-growth annealing conditions promote layer disordering in the uncapped portion 17 and suppress layer disordering in the capped portion 16 of the superlattice.

The superlattice can be grown by, for example, metal-organic vapor phase epitaxy, molecular beam epitaxy, or vapor phase epitaxy. The superlattice is preferably grown on a low dislocation substrate, such as AlN, GaN, or alloys thereof. Alternatively, the superlattice can be grown on a sapphire or SiC substrate, preferably with an intervening template layer of AlN, GaN, InGaN, or AlGaN. The III-nitride superlattice can comprise a plurality of AlGaN/AlN, GaN/AlN, GaN/AlGaN, InGaN/GaN, InGaN/AlN, InGaN/AlGaN, AlInN/GaN, AlInN/AlN, or AlInN/InGaN layers, preferably of less than 10 nm thickness. Although many impurities can be used, the impurity can comprise, for example, silicon, magnesium, selenium, or tellurium. The preferred dopant concentration will also depend on the particular III-nitride superlattice system and impurity, but can typically be greater than $5 \times 10^{18}$ cm$^{-3}$. For example, the dielectric capping layer can comprise SiN, SiON, or $SiO_2$. The growth and post-growth annealing temperatures will depend on the particular III-nitride superlattice system. However, the growth temperature can typically be less than 885° C. The post-growth annealing temperature can typically be greater than 700° C. and, more typically, can be greater than 1000° C. A carrier gas, for example, $N_2$, $NH_3$, $H_2$, or He, can be used during the post-growth anneal to further control layer disordering in the uncapped portions As an example of the invention, a silicon nitride ($SiN_x$) cap layer was shown to inhibit layer disordering of the heterointerfaces in Si-doped AlGaN/AlN intersubband structures. Portions of the superlattice capped with $SiN_x$ layer disorder at a slower rate compared to uncapped portions. Additionally, the thicker the $SiN_x$ layer, the slower the layer disordering. It is suggested that the $SiN_x$ layer prevents vacancies formation at the wafer surface, suppressing Si diffusion and layer disordering.

The exemplary intersubband superlattice structures were grown by metal-organic vapor phase epitaxy (MOVPE) on (0001) sapphire substrates misoriented 0.2° toward the m-plane. First, ~2 μm thick AlN template layers with dislocation densities of ~$3 \times 10^9$ cm$^{-2}$ and ~$10^{10}$ cm$^{-2}$ were grown on the substrate. All data presented below is with the superlattices grown on the low dislocation density template layers, except those for which the rate of layer disordering was compared versus dislocation density. Next, a superlattice was grown on the template layer at 800° C., consisting of 20 periods of $Al_{0.028}Ga_{0.972}N$ quantum wells (QWs) and AlN barrier layers that were ~14.5 Å and ~45 Å thick, respectively. The $Al_{0.028}Ga_{0.972}N$ QWs were Si-doped during growth with an electron concentration of ~$7 \times 10^{19}$ cm$^{-3}$. The superlattice has an intersubband absorption centered near ~1.56 μm. A ~20 nm AlN top layer was grown on the superlattice structure.

After growth, the intersubband samples were formed into waveguides by cutting out ~8-10 mm long pieces and polishing 45° facets, thereby creating a multipass waveguide. This waveguide was used to measure the intersubband absorption in a Fourier transform infrared spectrometer with a near-infrared polarizer to measure only transverse magnetic (TM) light. This measurement was performed on both as-grown and annealed samples with and without $SiN_x$ capping layers.

Following growth, a $SiN_x$ capping layer was deposited at a temperature of 250° C. on a portion of each sample via plasma-enhanced chemical vapor deposition (PECVD) using silane and nitrogen as sources. Capping layer thicknesses of 50 nm, 150 nm, 200 nm, and 250 nm were deposited to determine the layer disordering rate as a function of $SiN_x$ thickness. After deposition, the absorption spectra of the samples were measured without annealing. Then the samples were subject to 5 min. anneals in a rapid thermal annealer (RTA) at 1000° C. in $N_2$ with the sample oriented epitaxial side up. The annealing occurred for multiple times up to a cumulative total of 20 min., and the absorption measurements were performed after each 5 min. interval.

The transmissions for the uncapped portion of the sample compared with the portions capped with 150 nm of $SiN_x$ are shown in FIGS. 2(a) and 2(b). With increased annealing time both the uncapped and capped portions exhibit a redshift in wavelength and a simultaneous decrease in absorption. However, the $SiN_x$ capped portions redshift at a much slower rate compared to the uncapped portions. Clearly the $SiN_x$ cap is affecting the layer disordering occurring within the underlying $Al_{0.028}Ga_{0.972}N$/AlN superlattice. Since the layer disordering is triggered by Si impurity diffusion, the $SiN_x$ capping layer is most likely changing the rate of Si diffusion within the sample.

To explore this further, the $SiN_x$ thickness was varied using otherwise similar samples. The resulting change in absorption energy and absorption per pass are plotted in FIGS. 3(a) and 3(b). FIG. 3(a) is a graph of the change in energy of the absorption peak as a function of annealing time for samples capped with 0 to 250 nm of $SiN_x$. FIG. 3(b) is a graph of change in absorption of the peak as a function of annealing time for samples capped with 0 to 250 nm of $SiN_x$. The data for $SiN_x$ thickness of 0 nm is an average of all the uncapped areas of the samples. There is a redshift in wavelength and a decrease in absorption for all samples. However, as the $SiN_x$ thickness increases there is a decrease in the redshift and decrease in absorption. This dependence of layer disordering on the $SiN_x$ thickness is another indication that the $SiN_x$ cap has an effect on the Si diffusion within the samples.

Figure 4:
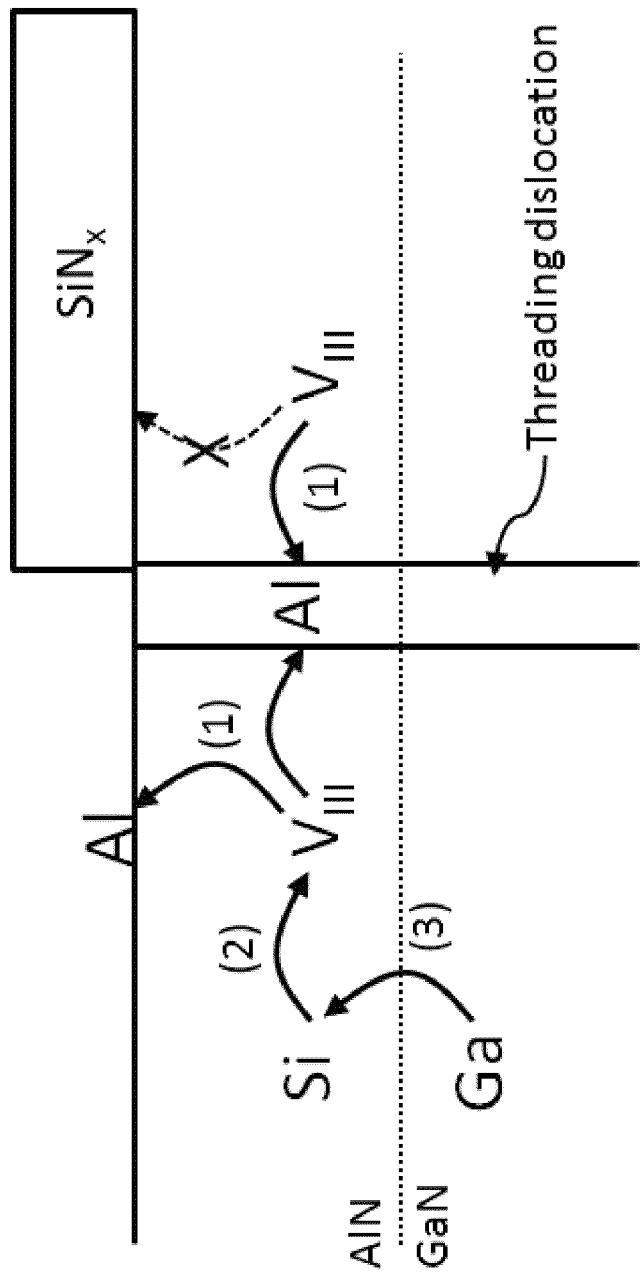
FIG. 4 is a schematic illustration of a possible model for selective layer disordering in III-nitride superlattices.

The dependence of layer disordering on the presence and thickness of the $SiN_x$ layer suggests the following layer disordering mechanism. A schematic illustration of this mechanism is shown in FIG. 4. The Si impurity is necessary for layer disordering as demonstrated previously. See J. J. Wierer et al., Appl Phys Lett 97, (2010), and U.S. application Ser. No. 13/558,516. Column III vacancies ($V_{III}$) can be created at the surface, or from a threading dislocation (1). This vacancy allows the Si to diffuse (2) as a substitutional mechanism via the column III vacancies. The movement of the Si allows for the Al or Ga to backfill (3) the column III vacancy sites, promoting intermixing of Al-rich and Ga-rich AlGaN QWs and barrier layers. Vacancies can be more easily created at the uncapped surface compared to the $SiN_x$ capped surface. Therefore, $SiN_x$ suppresses (X) vacancy formation and hence layer disordering. Furthermore, as the $SiN_x$ thickness increases the air interface at the top surface becomes farther from the superlattice, in turn further suppressing vacancy formation and layer disordering. Thus, the air interface is a source for vacancy formation, whilst the $SiN_x$ suppresses vacancy formation.

The $SiN_x$ layer cannot completely prevent layer disordering, indicating that there is a finite amount of vacancies in the as-grown superlattice and that other sources for vacancy creation are possible. This may be a reason why differences in layer disordering are found with different superlattice growth techniques. The deposition method and resulting crystallinity of the $SiN_x$ may also affect layer disordering.

Figure 5:
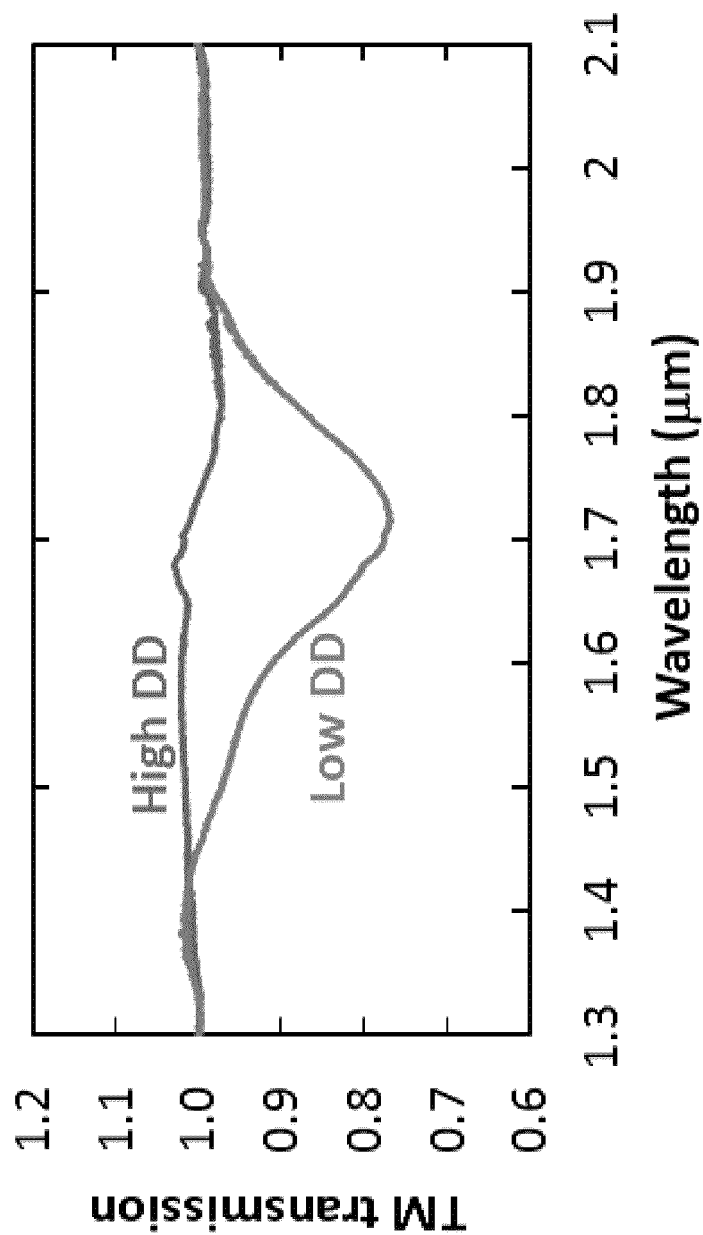
FIG. 5 is a graph of absorption spectra for superlattices grown on high- and low-dislocation substrates.

Another possible source of vacancies is threading dislocations that are prevalent in III-nitride semiconductors grown on sapphire substrates. Therefore, a change in the number of threading dislocations can result in a change in the rate of layer disordering. To test this hypothesis, superlattices were grown on substrates having different dislocation densities ($\sim 3 \times 10^9$ cm$^{-2}$ and $\sim 10^{10}$ cm$^{-2}$). The TM transmission of these two samples is shown in FIG. 5. The absorption in the higher dislocation density (DD) sample is much smaller compared to the low dislocation density sample. The threading dislocations present the superlattice with a large amount of surface area for addition vacancy formation and subsequent layer disordering. For samples with a high dislocation density substrate, layer disordering occurs during growth. These dislocations are also available for vacancy formation in post-growth annealing and can also contribute to the layer disordering during annealing. Therefore, threading dislocations can be an additional source of vacancy formation, even if a $SiN_x$ capping layer is used. Therefore, $SiN_x$ capping of intersubband samples to prevent layer disordering can become more effective as the threading dislocation density in the substrate is reduced. This can be accomplished by using a sapphire or SiC substrate with an intervening template layer, as described above. Alternatively, the superlattice can be grown on a low dislocation bulk substrate, such as AlN or GaN, with or without an intervening template layer.

The present invention has been described as a method for selective layer disordering in III-nitrides with a capping layer. It will be understood that the above description is merely illustrative of the applications of the principles of the present invention, the scope of which is to be determined by the claims viewed in light of the specification. Other variants and modifications of the invention will be apparent to those of skill in the art.

We claim:

1. A method for selective layer disordering in III-nitrides, comprising:
   growing a III-nitride superlattice comprising a periodic structure of layers of two or more III-nitride semiconductor materials with different band gaps on a substrate at a growth temperature chosen to prevent layer disordering during growth, wherein one or more of the superlattice layers are doped with an impurity during growth,
   depositing a dielectric capping layer on a portion of the surface of the superlattice to provide a capped portion and an uncapped portion, and
   annealing the superlattice at an annealing temperature and time sufficient to induce disordering of the superlattice layer interfaces due to diffusion of the impurity under the uncapped portion and suppress disordering of the interfaces under the capped portion.

2. The method of claim 1, wherein the III-nitride superlattice comprises a plurality of AlGaN/AlN, GaN/AlN, GaN/AlGaN, InGaN/GaN, InGaN/AlN, InGaN/AlGaN, AlInN/GaN, AlInN/AlN, or AlInN/InGaN layers.

3. The method of claim 1, wherein the impurity comprises silicon, magnesium, selenium, or tellurium.

4. The method of claim 1, wherein the dopant concentration in the superlattice is greater than $5 \times 10^{18}$ cm$^{-3}$.

5. The method of claim 1, wherein the growing comprises metal-organic vapor phase epitaxy, molecular beam epitaxy, and vapor phase epitaxy.

6. The method of claim 1, wherein the growth temperature is less than 885° C.

7. The method of claim 1, wherein the annealing temperature is greater than 700° C.

8. The method of claim 7, wherein the annealing temperature is greater than 1000° C.

9. The method of claim 1, wherein the annealing occurs in a carrier gas.

10. The method of claim 9, wherein the carrier gas comprises $N_2$, $NH_3$, $H_2$, or He.

11. The method of claim 1, wherein the substrate comprises sapphire, SiC, AlN, GaN, or alloys thereof.

12. The method of claim 11, wherein the substrate further comprises an intervening template layer having a low dislocation density deposited on the substrate.

13. The method of claim 12, wherein the template layer comprises AlN, GaN, InGaN, or AlGaN.

14. The method of claim 1, wherein the dielectric capping layer comprises SiN, SiON, or $SiO_2$.

15. The method of claim 1, wherein the thickness of the layers is less than 10 nanometers.

16. The method of claim 1, wherein the superlattice has an energy transition and wherein the uncapped portion has an energy transition shifted in wavelength from the capped portion.

17. The method of claim 16, wherein the energy transition is intersubband and the uncapped portion is shifted to a longer wavelength from the capped portion.

18. The method of claim 16, wherein the energy transition is interband and the uncapped portion is shifted to a shorter wavelength from the capped portion.

* * * * *